United States Patent
Ikuta (10) Patent No.: US 10,928,721 B2
(45) Date of Patent: Feb. 23, 2021

(54) REFLECTIVE MASK BLANK FOR EUV LITHOGRAPHY

(71) Applicant: AGC, Inc., Chiyoda-ku (JP)

(72) Inventor: Yoshiaki Ikuta, Chiyoda-ku (JP)

(73) Assignee: AGC, Inc., Chiyoda-ku (JP)

( * ) Notice: Subject to any disclaimer, the term of this patent is extended or adjusted under 35 U.S.C. 154(b) by 0 days.

(21) Appl. No.: 15/168,572

(22) Filed: May 31, 2016

(65) Prior Publication Data

US 2016/0357100 A1 Dec. 8, 2016

(30) Foreign Application Priority Data

Jun. 8, 2015 (JP) ............................... JP2015-115884

(51) Int. Cl.
*G06F 1/24* (2006.01)
*G03F 1/24* (2012.01)

(52) U.S. Cl.
CPC ...................................... *G03F 1/24* (2013.01)

(58) Field of Classification Search
CPC ...................................... G03F 1/24; G03F 1/22
See application file for complete search history.

(56) References Cited

U.S. PATENT DOCUMENTS

| | | | |
|---|---|---|---|
| 2002/0076625 A1* | 6/2002 | Shoki | B82Y 10/00 430/5 |
| 2010/0068632 A1* | 3/2010 | Ono | B82Y 10/00 430/5 |
| 2014/0212794 A1* | 7/2014 | Maeshige | G03F 1/24 430/5 |
| 2015/0017574 A1* | 1/2015 | Orihara | G03F 1/22 430/5 |

FOREIGN PATENT DOCUMENTS

| | | |
|---|---|---|
| JP | 2002-299228 | 10/2002 |
| JP | 2003-501823 | 1/2003 |
| JP | 2004-128490 | 4/2004 |

OTHER PUBLICATIONS

J. Sohn, et al., "Implementing E-beam Correction Strategies for Compensation of EUVL Mask Non-flatness", Proceeding of 2009 International Symposium on Extreme Ultraviolet Lithography, 2009, 26 pgs.
Harry J. Levinson, et al., "Minimization of Total Overlay Errors on Product Wafers Using an Advanced Optimization Scheme", SPIE, vol. 3051, 1997, 12 pgs.
Chun Yen Huang, et al., "Using Intra-Field High Order Correction to Achieve Overlay Requirement beyond Sub-40nm Node", Proc. of SPIE, vol. 7272 72720I-1, 2009, 9 pgs.

* cited by examiner

*Primary Examiner* — Daborah Chacko-Davis
(74) *Attorney, Agent, or Firm* — Oblon, McClelland, Maier & Neustadt, L.L.P.

(57) ABSTRACT

To provide a reflective mask blank for EUV lithography which is excellent in flatness, whereby the deterioration of the overlay accuracy at the time of pattern transfer can be relatively easily corrected, and the deterioration of the overlay accuracy due to the flatness is small.
A reflective mask blank for EUVL, which is a reflective mask blank for EUV lithography having a reflective layer for reflecting EUV light and an absorber layer for absorbing EUV light formed in this order on the main surface of a substrate and having a conductive film formed on the rear surface opposite to the main surface, of the substrate, wherein when the shapes of quality-guaranteed regions of the main surface and the rear surface of the reflective mask blank for EUVL are measured by a laser interferometer, and the measured values obtained are fitted to quadratic function, the proportion of the quadratic function components is at least 35%, and the flatness at the quality-guaranteed regions of the main surface and the rear surface is at most 600 nm.

17 Claims, 1 Drawing Sheet

REFLECTIVE MASK BLANK FOR EUV LITHOGRAPHY

FIELD OF INVENTION

The present invention relates to a reflective mask blank for EUV (Extreme Ultraviolet) lithography (hereinafter referred to as "EUV mask blank" in this specification) to be used for the production of semiconductors, etc.

BACKGROUND OF INVENTION

Heretofore, in the semiconductor industry, a photolithography method employing visible light or ultraviolet light has been used as a technique to transfer a fine pattern required to form an integrated circuit of a fine pattern on e.g. a silicon substrate. However, the conventional photolithography method has come close to its limit, while miniaturization of semiconductor devices has been accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF excimer laser (wavelength: 193 nm) is employed, about 45 nm is presumed to be the limit. From this point of view, EUV lithography, which is an exposure technique employing EUV light having a wavelength further shorter than ArF excimer laser, is expected to be prospective as a next generation exposure technique for 45 nm or below. In this specification, EUV light means a light ray having a wavelength within a soft X-ray region or within a vacuum ultraviolet region, specifically a light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional refractive system like photolithography employing visible light or ultraviolet light. For this reason, in EUV lithography, a reflective system, i.e. a reflective photomask and a mirror, is employed.

A mask blank is a stacked member before patterning, to be employed for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a multilayer reflective film having a low refractive index film and a high refractive index film alternately stacked to have the light reflectivity improved when its surface is irradiated with EUV light. As the low refractive index layer in the multilayer reflective film, a molybdenum (Mo) layer is usually used, and as the high refractive index layer, a silicon (Si) layer is usually used.

For the absorber layer, a material having a high absorption coefficient to EUV light, specifically e.g. a material containing chromium (Cr) or tantalum (Ta) as the main component, is used.

A sputtering method such as an ion beam sputtering method or a magnetron sputtering method is usually used for forming the multilayer reflective film and the absorber layer.

In the case of the EUV lithography, a pattern on a photomask is transferred onto a wafer by using a semiconductor exposure tool. As a means to hold a photomask at a mask stage of the semiconductor exposure tool, suction holding by electrostatic chuck is employed. Thus, in the case of the EUV mask blank, sandwiching a substrate, a multilayer reflective film and a conductive film on the opposite side (rear surface conductive film) to the multilayer reflective film are formed.

As described above, an EUV mask blank is produced by forming thin films such as a reflective layer (multilayer reflective film), an absorber layer and a rear surface conductive film on a substrate, however, at the time of forming the thin films on the substrate, a film stress (compression stress or tensile stress) may sometimes be formed in the films stacked on the substrate. If such a film stress is exerted on the substrate, the substrate may be deformed. As the substrate for the EUV mask blank, a relatively thick glass substrate having a thickness of 0.25 inch (6.3 mm) was used, the modulus of rigidity of the glass material constituting the substrate was relatively high at a level of about 30 GPa, and thereby the deformation of the substrate due to a film stress was slight. Thus, heretofore, the film stress was not problematic.

However, as fine patterning has now been required, the deterioration in the flatness of a mask blank due to slight deformation of the substrate (deformation of the substrate due to a film stress) which was not problematic heretofore, has now become problematic. Specifically, if the flatness of the mask blank deteriorates due to the deformation of the substrate, when a mask pattern of a reflective mask produced from the EUV mask blank is transferred onto a wafer by using a semiconductor exposure tool, the position of image formation of the pattern is misaligned from the wafer surface, and thereby the accuracy of pattern transferring deteriorates, the size of a circuit pattern formed on the wafer is deviated, and a semiconductor device having required properties cannot be obtained, such being problematic. Further, if the flatness of the mask blank deteriorates due to the deformation of the substrate, when a mask pattern of a reflective mask produced from the EUV mask blank is transferred onto a wafer, the position to form the pattern is misaligned from the desired position. Here, a semiconductor device has a structure in which circuit patterns formed by lithography process are stacked in the form of layers, and an upper layer circuit pattern is formed at a desired position depending on the formed position of a lower layer pattern, whereby a semiconductor device having required properties is produced. Thus, if the flatness of the mask blank deteriorates, and the position to form a pattern is misaligned from the desired position, a semiconductor device having required properties such as switching rate of a transistor and a leak current cannot be obtained, such being problematic (Patent Document 1).

The amount of misalignment from the desired position to form a pattern is called overlay accuracy. As the size of a circuit of a semiconductor device becomes small, the smaller overlay accuracy is required. In a case where a pattern on a mask blank is reduction-projected on a wafer to ¼ times without correction, the influence of the flatness of an EUV mask blank on the overlay accuracy can be calculated by Overlay accuracy=flatness of EUV mask blank×¼₀     Formula (1)

(Non-Patent Document 1). The smaller the flatness of the EUV mask blank is, the smaller the overlay accuracy is, such being preferred. Accordingly, as the size of a circuit for a semiconductor device becomes small year by year, the required value of the flatness of the EUV mask blank becomes small. For example, in the technology roadmap for semiconductors (The International Technology Roadmap for Semiconductors) year 2012, the required value of the flatness (Blank Bow) of the EUV mask blank is at most 400 nm in year 2015, at most 300 nm in year 2018 and at most 200 nm in year 2021, and the required value of the flatness is becoming severer year by year. In a case where the flatness of the EUV mask blank falls within such a range, the overlay accuracy based on the required values of the flatness of the mask blank can be calculated by the formula (1) to be 10 nm, 7.5 nm and 5 nm. They are larger by from about 2.4 to 2.5 times than the required values of the overlay accuracy (at most 4.2 nm in year 2015, at most 3.0 nm in year 2018 and at most 2.1 nm in year 2021) in Logic of the roadmap, such being problematic.

However, in a case where a circuit pattern on a mask is reduction-projected onto a wafer by using a semiconductor exposure tool, the position of the pattern transfer can be corrected to some extent. Particularly, in a case where a scanning type semiconductor exposure tool which is mainstream at present is used, the deterioration of the overlay accuracy due to a first order polynomial component and a second order polynomial component of the flatness of the mask blank can be prevented, since the scanning type semiconductor exposure tool has respective correction abilities to correct the magnification at the time of the reduction-projection to the scanning direction and the perpendicular direction to the scanning direction independently each other (Non-Patent Document 2 and 3). Thus, in a case where the flatness of the mask blank is approximated to polynomial, the proportion of 0 to second order polynomial component (quadratic function component) is preferably increased as much as possible, and the proportion of high order polynomial component of at least third order is preferably reduced as much as possible, whereby by the correction at the time of reduction-projection exposure, the deterioration of the overlay accuracy due to the flatness of the mask blank can be prevented.

PRIOR ART DOCUMENTS

Patent Documents

Patent Document 1: JP-A-2002-299228
Patent Document 2: JP-A-2003-501823
Patent Document 3: JP-A-2004-128490

Non-Patent Documents

Non-Patent Document 1: J. Sohn, K. Orvek, R. Engelstad, P. Vukkadala, S. Yoshitake, S. Raghunathan, T. Laursen, J. Zimmerman, B. Connolly, and J. H. Peters, Implementing E-beam Correction Strategies for Compensation of EUVL Mask Non-flatness, Proceeding of 2009 International Symposium on Extreme Ultraviolet Lithography, Oct. 18-21, 2009, Prague, Czech Republic
Non-Patent Document 2: Harry J. Levinson, Moshe E. Preil and Patrick J. Lord, Minimization of Total Overlay Errors on Product Wafers Using an Advanced Optimization Scheme, SPIE Vol. 3051, pp. 362-373
Non-Patent Document 3: Chun Yen Huang, Chuei Fu Chue, An-Hsiung Liu, Wen Bin Wu, Chiang Lin Shih, Tsann-Bim Chiou, Juno Lee, Owen Chen, Alek Chen, Using Intra-Field High Order Correction to Achieve Overlay Requirement beyond Sub-40 nm Node, Proc. of SPIE Vol. 7272 727201-1

SUMMARY OF INVENTION

Technical Problem

It is an object of the present invention to provide a reflective mask blank for EUVL which is excellent in the flatness, whereby the deterioration of the overlay accuracy due to the flatness can be relatively easily corrected at the time of pattern transfer, and the deterioration of the overlay accuracy due to the flatness is little, in order to overcome the above-described problems in the conventional technologies.

Solution to Problem

In order to accomplish the above object, the present invention provides (1) a reflective mask blank for EUVL, which is a reflective mask blank for EUV lithography having a reflective layer for reflecting EUV light and an absorber layer for absorbing EUV light formed in this order on the main surface of a substrate and having a conductive film formed on the rear surface opposite to the main surface, of the substrate, wherein when the shapes of quality-guaranteed regions of the main surface and the rear surface of the reflective mask blank for EUVL are measured by a laser interferometer, and the measured values obtained are fitted to quadratic function, the proportion of the quadratic function components is at least 35%, and the flatness at the quality-guaranteed regions of the main surface and the rear surface is at most 600 nm.

Further, the present invention provides (2) a reflective mask blank for EUVL, which is a reflective mask blank for EUV lithograph having a reflective layer for reflecting EUV light and an absorber layer for absorbing EUV light formed in this order on the main surface of a substrate and having a conductive film formed on the rear surface opposite to the main surface, of the substrate, wherein when the shapes of quality-guaranteed regions of the main surface and the rear surface of the reflective mask blank for EUVL are measured by a laser interferometer, and the measured values obtained are fitted to quadratic function to obtain central coordinates F and B, the distances between the central coordinates F and B obtained and the center coordinate C of the substrate are at most 0.5 mm, and the flatness at the quality-guaranteed regions of the main surface and the rear surface is at most 600 nm.

Further, the present invention provides (3) a reflective mask blank for EUVL, which is a reflective mask blank for EUV lithography having a reflective layer for reflecting EUV light and an absorber layer for absorbing EUV light formed in this order on the main surface of a substrate and having a conductive film formed on the rear surface opposite to the main surface, of the substrate, wherein the shapes of quality-guaranteed regions of the main surface and the rear surface of the reflective mask blank for EUVL and the shapes of quality-guaranteed regions of the main surface and the rear surface of the substrate before forming the reflective layer, the absorber layer and the conductive film are measured by a laser interferometer respectively, and the differences between the shapes of quality-guaranteed regions of the main surface and the rear surface of the reflective mask blank for EUVL and the shapes of quality-guaranteed regions of the main surface and the rear surface of the substrate, are fitted to quadratic function to obtain central coordinates $\Delta F$ and $\Delta B$, the distances between the central coordinates $\Delta F$ and $\Delta B$ obtained and the center coordinate C of the substrate are at most 0.5 mm, and the flatness at the quality-guaranteed regions of the main surface and the rear surface is at most 600 nm.

Further, in the reflective mask blanks for EUVL (2) and (3), it is preferred that after forming at least one selected from the group consisting of the reflective layer, the absorber layer and the conductive film, heating treatment is carried out, and when the shapes of quality-guaranteed regions of the main surface and the rear surface are measured by a laser interferometer respectively before and after the heating treatment, and the differences of the shapes of the quality-guaranteed regions of the main surface and the rear surface before and after the heating treatment, are fitted to quadratic function to obtain central coordinates $\Delta F_h$ and $\Delta B_h$, the distances between the central coordinates $\Delta F_h$ and $\Delta B_h$ obtained and the center coordinate C of the substrate are at most 0.5 mm.

In the reflective mask blanks for EUVL (1) to (3), between the reflective layer and the absorber layer, a protective layer for the reflective layer may be formed.

In the reflective mask blanks for EUVL (1) to (3), on the absorber layer, a low reflective layer for inspection light to be used for inspection of a mask pattern may be formed.

Advantageous Effects of Invention

The reflective mask blank for EUVL of the present invention satisfies the required value (600 nm) for the flatness and has a high proportion of the quadratic function components of the flatness of the mask blank at a level of at least 35%, whereby the deterioration of the overlay accuracy due to the flatness of the mask blank can be corrected by e.g. the correction of the exposure magnification of a semiconductor exposure tool at the time of the pattern transfer. Thus, when a pattern on a mask is transferred onto a wafer, the pattern can be transferred at the desired position on the wafer, and the required value for the overlay accuracy can be satisfied.

DETAILED DESCRIPTION OF INVENTION

Now, the present invention will be described with reference to the drawings.

Figure 1:
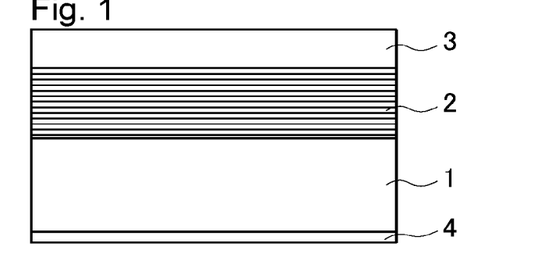
FIG. 1 is a schematic cross-sectional view illustrating one embodiment of the reflective mask blank for EUVL of the present invention.

FIG. 1 is a schematic cross-sectional view illustrating one embodiment of the reflective mask blank for EUVL of the present invention. The reflective mask blank for EUVL illustrated in FIG. 1 has a reflective layer 2 for reflecting EUV light and an absorber layer 3 for absorbing EUV light formed in this order on the main surface (in the Figure, the upper surface of substrate 1) of a substrate 1. On the rear surface (in the Figure, the lower surface of substrate 1) opposite to the main surface, of the substrate 1, a conductive film (rear surface conductive film) 4 is formed.

Now, the individual constituting elements of the reflective mask blank for EUVL will be described.

The substrate 1 is required to satisfy properties as a substrate for a reflective mask blank for EUVL. Therefore, the substrate 1 is preferably one having a low thermal expansion coefficient (specifically, the thermal expansion coefficient at 20° C. is preferably $0\pm1.0\times10^{-7}/°$ C., more preferably $0\pm0.5\times10^{-7}/°$ C., further preferably $0\pm0.2\times10^{-7}/°$ C., further preferably $0\pm0.05\times10^{-7}/°$ C.) and as the surface roughness (Root Mean Square), a smoothness of at most 0.15 nm and a flatness of at most 100 nm as defined in JIS-B0601-2001 standard, and being excellent in the resistances against various cleaning fluids such as an acid and an alkali used for e.g. cleaning a mask blank or a photomask after forming a pattern. As the substrate 1, specifically, glass having a low thermal expansion coefficient, e.g. one formed by grinding or polishing $SiO_2$—$TiO_2$ type glass by a known method, may be used. However, the substrate is not restricted thereto, and it is possible to employ a substrate of e.g. crystallized glass having β-quartz solid solution precipitated, quartz glass, silicon or metal, which is ground or polished by a known method. Further, a film such as a stress correction film or a surface smoothing film may be formed on the substrate 1.

The size, thickness, etc. of the substrate 1 are suitably determined depending upon e.g. the designed values of the mask. In Examples given hereinafter, a $SiO_2$—$TiO_2$ type glass having a size of 6 inch (152 mm) square and a thickness of 0.25 inch (6.3 mm) was used.

It is preferred that no defect is present on the surface of the substrate 1 on the side where the reflective layer 2 is to be formed. However, even in a case where a defect is present, in order not to cause a phase defect due to a concave defect and/or a convex defect, it is preferred that the concave defect or the convex defect is preferably at most the sphere equivalent volume diameter (namely "SEVD", for the definition, please refer to e.g. Proc. SPIE. 7969, Extreme Ultraviolet (EUV) Lithography II, 796902) of the concave defect or the convex defect.

The property particularly required for the reflective layer 2 is a high EUV light reflectivity, as the reflective layer of the EUV mask blank. Specifically, when the surface of the reflective layer 2 is irradiated with EUV light at an incident angle of 6°, the maximum light beam reflectivity in the vicinity of a wavelength of 13.5 nm is preferably at least 60%, more preferably at least 63%, further preferably at least 65%.

As the reflective layer 2, a multilayer reflective film having high reflective layers having a high refractive index to EUV light and low reflective layers having a low refractive index to EUV light alternatively stacked plural times is usually used, since a high reflectivity to EUV light can be accomplished. In the multilayer reflective film as the reflective layer 2, Si is widely used as the high reflective layer, and Mo is widely used as the low reflective layer. That is, it is most common to use a Mo/Si multilayer reflective film. However, the multilayer reflective film is not limited to such a film, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film ay also be used.

The film thicknesses and the number of repeating units of the respective layers constituting the multilayer reflective film of the reflective layer 2 are suitably selected depending on film materials to be used and the required reflectivity of the reflective layer to EUV light. For example, in the case of the Mo/Si reflective film, a multilayer reflective film is formed by stacking Mo films having a film thickness of 2.3±0.1 nm and Si films having a film thickness 4.5±0.1 nm so that the number of repeating units would be from 30 to 60, whereby the reflective layer 2 having at least 60% of the maximum value of the reflectivity to EUV light is formed.

Here, the respective layers constituting the multilayer reflective film as the reflective layer 2 may be formed to have the desired thicknesses by means of a known film forming method such as a magnetron sputtering method or an ion beam sputtering method. For example, in the case of forming a Mo/Si multilayer reflective film by means of an ion beam sputtering method, it is preferred that a Si film is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3 \times 10^{-2}$ Pa to $2.7 \times 10^{-2}$ Pa) as the sputtering gas, and then, a Mo film is formed to have a thickness of 2.3 nm at an ion accelerating voltage of from 300 to 1,500 V and a film-deposition rate of from 0.03 to 0.30 nm/sec by using a Mo target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by stacking the Mo layer and the Si layer from 30 to 60 cycles.

The property particularly required for the absorber layer 3 is that the EUV light reflectivity is extremely low. Specifically, the maximum light reflectivity in the vicinity of a wavelength of 13.5 nm at the time of irradiating the surface of the absorber layer 3 with a light ray in the wavelength region of EUV light, is preferably at most 6%.

In order to attain the above property, the absorber layer 3 is preferably made of a material having a high absorption coefficient to EUV light. As the material having a high absorption coefficient to EUV light, a material containing tantalum (Ta), chromium (Cr), aluminum (Al), titanium (Ti), tungsten (W), palladium (Pd), nickel (Ni) or hafnium (Hf) as the main component is preferably used. In the present specification, "material containing the above element as the main component" means a material containing at least 30 at % of the above element.

A material to be used for the absorber layer 3 preferably contains at least one component selected from the group consisting of boron (B), hydrogen (H), nitrogen (N), silicon (Si) and carbon (C), in addition to the above components. Other than Ta, as specific examples of the material containing the above element, TaN, TaNH, TaBSi, TaBSiN, TaB, TaBN, TaSi, TaSiN, NiSi, NiN or TiN may be mentioned.

Further, the thickness of the absorber layer 3 is preferably from 50 to 100 nm.

The absorber layer 3 having the above construction may be formed by a film forming method such as a sputtering method e.g. a magnetron sputtering method or an ion beam sputtering method.

For example, when a TaNH film is to be formed as the absorber layer 3 by a magnetron sputtering method, it is preferred that the film is formed by using a Ta target as a target and a mixed gas of Ar, $N_2$ and $H_2$ ($H_2$ gas concentration: from 1 to 30 vol %, $N_2$ gas concentration: from 5 to 75 vol %, Ar gas concentration: from 10 to 94 vol %, gas pressure: from $0.5 \times 10^{-1}$ Pa to 1.0 Pa) as a sputtering gas, at applied power of from 300 to 2,000 W and at a film-deposition rate of from 0.5 to 60 nm/min, so as to be a thickness of from 20 to 90 nm.

For the conductive film (rear conductive film) 4, the electrical conductivity and the thickness of the constituting material are selected so that the sheet resistance would be at most 100Ω/□. The constituting material for the conductive film (rear conductive film) 4 may be widely selected from those mentioned in known documents. For example, a high dielectric constant material layer mentioned in JP-A-2003-501823, specifically a material layer selected from the group consisting of silicon, TiN, molybdenum, chromium and TaSi may be mentioned. Further, a conductive film (CrN film) containing chromium and nitrogen as mentioned in JP-A1-2008-072706 may be mentioned. The CrN film may be formed by a dry film forming method, specifically by a dry film forming method such as a sputtering method such as a magnetron sputtering method or an iron beam sputtering method, a CVD method or a vacuum deposition method. In a case where the CrN film is formed by a magnetron sputtering method, the magnetron sputtering may be carried out by using a Cr target as the target and a mixed gas of Ar and N2 as the sputtering gas, and specifically, the magnetron sputtering may be carried out under the following film-deposition condition.

Target: Cr target

Sputtering gas: mixed gas of Ar and $N_2$ ($N_2$ gas concentration: from 3 to 45 vol %, preferably from 5 to 40 vol %, more preferably from 10 to 35 vol %, gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Applied power: from 30 to 1,000 W, preferably from 50 to 750 W, more preferably from 80 to 500 W Film-deposition rate: from 2.0 to 60 nm/m In the reflective mask blank for EUVL of the present invention, a protective layer may be formed between the reflective layer 2 and the absorber layer 3. The protective layer is provided for the purpose of protecting the reflective layer 2, so that at the time of forming a pattern on the absorber layer 3 by etching (usually dry etching), the reflective layer 2 would not be damaged by the etching. Accordingly, as the material for the protective layer, a material hardly susceptible to an influence by the etching of the absorber layer 3 i.e. having an etching rate slower than the absorber layer 3 and hardly susceptible to damage by such etching, is selected. The material satisfying such requirements may, for example, be Cr, Al or Ta and a nitride thereof, Ru or a Ru compound (such as RuB or RuSi), $SiO_2$ $Si_3N_4$ or a $Al_2O_3$ or a mixture thereof. Among them, Ru or a Ru compound (such as RuB or RuSi) or CrN or $SiO_2$ is preferred, and Ru or a Ru compound (such as RuB or RuSi) is particularly preferred.

Further, in a case where the protective layer is to be formed, the thickness of the protective layer is preferably from 1 to 60 nm, more preferably from 1 to 40 nm.

In a case where the protective layer is to be formed, the film is formed by a known film-forming method such as a magnetron sputtering method or an ion beam sputtering method. In the case of forming a Ru film by means of a magnetron sputtering method, it is preferred that the Ru film is formed to have a thickness of from 2 to 5 nm by using a Ru target as the target and Ar gas (gas pressure: from $1.0 \times 10^{-2}$ Pa to $10 \times 10^{-1}$ Pa) as the sputtering gas at an applied power of from 30 to 1,500 V and at a film-deposition rate of from 1.2 to 60 nm/min.

Further, even in a case where the protective layer is provided on the reflective layer 2, the maximum value of the reflectivity of the light ray in the vicinity of a wavelength of 13.5 nm is preferably at least 60%, more preferably at least 63%, further preferably at least 65%.

Further, in the reflective mask blank for EUVL of the present invention, a low reflective layer for inspection light to be used for inspection of a mask pattern may be formed on the absorber layer 3.

The low reflective layer is formed so as to be a film having a low reflectivity to inspection light to be used for inspection of a mask pattern. In the preparation of a EUV mask, after forming a pattern on the absorber layer, inspection is carried out to see whether this pattern is formed as designed or not. In this inspection of the mask pattern, an inspection machine using light of usually about 257 nm as inspection light, is employed. That is, the inspection is made by the difference in reflectivity of such light of about 257 nm, specifically by the difference in the reflectivity between a surface exposed by removal of the absorber layer by patterning and the surface of the absorber layer remained without being removed by the patterning. Here, the former is the surface of the reflective layer or the surface of the protective layer, and is usually the surface of the protective layer. Therefore, if the difference in the reflectivity between the reflective layer surface or the protective layer surface and the absorber layer surface to the wavelength of inspection light is small, the contrast at the time of the inspection becomes poor, and accurate inspection may not be possible. In a case where the difference in the reflectivity between the reflective layer surface or the protective layer surface and the absorber layer surface to the wavelength of inspection light is small, by forming a low reflective layer, the contrast at the time of the inspection is improved. In a case where a low reflective layer is formed on the absorber layer, when the low reflective layer surface is irradiated with light in the wavelength region of inspection light, the maximum light reflectivity of the low reflective layer at the wavelength of inspection light, is preferably at most 15%, more preferably at most 10%, further preferably at most 5%.

To attain the above-described properties, the low reflective layer is preferably made of a material having a refractive index lower than the absorber layer at the wavelength of the inspection light.

As the low reflective layer satisfying these properties, there is one containing at least one selected from the group consisting of tantalum (Ta), chromium (Cr), aluminum (Al), titanium (Ti), tungsten (W), palladium (Pd), nickel (Ni), hafnium (Hf) and silicon (Si) and at least one selected from the group consisting of oxygen (O) and nitrogen (N). As preferred examples of such a low reflective layer, a TaO layer, a TaON layer, a TaBO layer, a TaSiO layer, a CrO layer, a CrON layer, a SiO layer, a SiON layer, a SiN layer, a HfO layer and a HfON layer may be mentioned.

The total content of Ta, Pd, Cr, Si and Hf in the low reflective layer is preferably from 10 to 55 at %, particularly preferably from 10 to 50 at %, whereby the optical properties in the wavelength region of the pattern inspection light can be controlled.

Further, the total content of O and N in the low reflective layer is preferably from 45 to 90 at %, particularly preferably from 50 to 90 at %, whereby the optical properties in the wavelength region of the pattern inspection light can be controlled. Further, the total content of Ta, Pd, Cr, Si, Hf, O and N in the low reflective layer is preferably from 95 to 100 at %, more preferably from 97 to 100 at %, further preferably from 99 to 100 at %.

A low reflective layer having the above construction can be formed by carrying out a sputtering method using a target containing at least one selected from the group consisting of Ta, Pd, Cr, Si and Hf. Here, as the target, whichever metal targets of the above-mentioned at least two types or a compound target may be used.

Further, it is preferred to use metal targets of at least two types to control the constitution component of the low reflective layer. Further, in a case where the metal targets of at least two types are used, by controlling applied power on the targets, the constitution component of absorber layer can be controlled. On the other hand, in a case where the compound target is used, it is preferred to preliminarily control the target composition so that a low reflective layer to be formed would have the desired composition.

The sputtering method using the above target may be carried out under an inert gas atmosphere in the same manner as in the sputtering method for forming the absorber layer.

Here, in a case where the low reflective layer contains O, the sputtering method is carried out under an inert gas atmosphere containing at least one selected from the group consisting of He, Ar, Ne, Kr and Xe and containing $O_2$. In a case where the low reflective layer contains N, the sputtering method is carried out under an inert gas atmosphere containing at least one selected from the group consisting of He, Ar, Ne, Kr and Xe and containing $N_2$. In a case where the low reflective layer contains O and N, the sputtering method is carried out under an inert gas atmosphere containing at least one selected from the group consisting of He, Ar, Ne, Kr and Xe and containing $O_2$ and $N_2$.

The specific condition for carrying out the sputtering method varies depending on a target to be used or the composition of an inert gas atmosphere for carrying out the sputtering method, however, in any cases, the sputtering method may be carried out under the following conditions.

The conditions for forming the low reflective layer are mentioned below, taking as an example, a case where the inert gas atmosphere is a mixed gas atmosphere of Ar and $O_2$.

Conditions for Forming the Low Reflective Layer

Gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa Sputtering gas: mixed gas of Ar and $O_2$ ($O_2$ gas concentration: from 3 to 80 vol %, preferably from 5 to 60 vol %, more preferably from 10 to 40 vol %)

Applied power: from 30 to 1,000 W, preferably from 50 to 750 W, more preferably from 80 to 500 W Film-deposition rate: from 0.01 to 60 nm/min, preferably from 0.05 to 45 nm/min, more preferably from 0.1 to 30 nm/m in Here, in a case where an inert gas other than Ar or plural inert gases are used, the total concentration of such inert gas is adjusted to be within the same concentration range as the above Ar gas concentration.

Here, the reason why it is preferred to form the low reflective layer on the absorber layer as in the reflective mask blank for EUVL of the present invention, is that the wavelength of mask pattern inspection light is different from the wavelength of EUV light. Therefore, in a case where EUV light (in the vicinity of 13.5 nm) is used as the mask pattern inspection light, it is considered unnecessary to form the low reflective layer on the absorber layer. The wavelength of mask pattern inspection light tends to be shifted toward a low wavelength side as the size of a pattern becomes small, and in future, it is considered to be shifted to 193 nm or further to 13.5 nm. In the case where the wavelength of inspection light is 13.5 nm, it is considered unnecessary to form the low reflective layer on the absorber layer.

As described above, in a case where a circuit pattern on a mask is reduction-projected on a wafer by means of a semiconductor exposure tool, the magnifications at the time of the reduction-projection to the scanning direction and the perpendicular direction to the scanning direction are corrected independently each other, whereby the deterioration of the overlay accuracy due to the first order polynomial component and the second order polynomial component of the flatness of the mask blank can be prevented. Thus, when the flatness of the mask blank is approximated to polynomial, it is preferred that the proportion of 0 to second order polynomial components (quadratic function component) is increased as much as possible, and the proportion of high order polynomial components of at least third order is reduced as much as possible, whereby the deterioration of the overlay accuracy due to the flatness of the mask blank can be corrected by the correction at the time of the semiconductor exposure tool.

In the reflective mask blank for EUVL of the present invention, when the shapes of quality-guaranteed regions of the main surface and the rear surface of the reflective mask blank for EUVL are measured by a laser interferometer, and the measured values obtained are fitted to quadratic function, the proportion of the quadratic function components (hereinafter, in the present specification, also referred to as "quadratic function components of the surface shape") is at least 35%.

Further, the quadratic function components of the surface shapes can be represented by the following formula:

$$Z=a+bX+cY+dXY+eX^2+fY^2$$

wherein a, b, c, d, e and f are constant, and X, Y, and Z are variable. Here, in the minimum square plane surface of the main surface or the rear surface of the mask blank, X and Y are Cartesian coordinate system of which the origin is the center of the substrate. Z is a coordinate system being orthogonal to X axis and Y axis and represents the main surface or the rear surface of the mask blank at the point (X, Y).

In the case of the structure illustrated in FIG. 1, the main surface of the reflective mask blank for EUVL is the absorber layer 3 surface, and its quality-guaranteed region is a region of 142×142 mm. The rear surface of the reflective mask blank for EUVL is the rear conductive film 4 surface, and its quality-guaranteed region is a region of 146×146 mm. Further, in a case where a low reflective layer is formed on the absorber layer 3, the main surface of the reflective mask blank for EUVL is the absorber layer 3 surface, and its quality-guaranteed region is a region of 142×142 mm. The above-described quality-guaranteed regions are regions in SEMI Standard at p. 37, and depending on regions on which a mask pattern is formed or the specification of the semiconductor exposure tool, the quality-guaranteed regions are different from the above ranges. Thus, the quality-guaranteed regions are not restricted to the above ranges.

When the proportion of the above-defined quadratic function components of the surface shapes is at least 35%, regarding the position of a pattern to be formed on a wafer, the error of the position from the desired position is small at a level of at most 10 nm by correcting the exposure magnification of the semiconductor exposure tool at the time of transferring the pattern or the like, and a semiconductor device having expected properties can be produced.

In the reflective mask blank for EUVL of the present invention, the proportion of the quadratic function components of the surface shapes in the quality-guaranteed regions of the main surface and the rear surface is preferably at least 40%, more preferably at least 45%, further preferably at least 55%, further preferably at least 65%.

Further, in the reflective mask blank for EUVL of the present invention, the flatness obtained by measuring the shapes of the quality-guaranteed regions of the main surface and the rear surface is small, and the flatness at the quality-guaranteed regions of the main surface and the rear surface is at most 600 nm, preferably at most 500 nm, more preferably at most 400 nm, further preferably at most 300 nm, further preferably at most 250 nm.

In order to obtain the reflective mask blank for EUVL of the present invention wherein the proportion of the quadratic function components of the above-described surface shapes is at least 35%, the following procedure may be carried out.

The shapes of the quality-guaranteed regions of the main surface and the rear surface of the reflective mask blank for EUVL are measured by a laser interferometer. In the case of the construction illustrated in FIG. 1, the main surface of the reflective mask blank for EUVL is the absorber layer 3 surface. In a case where a low reflective layer is formed on the absorber layer 3, the main surface is the low reflective layer surface. On the other hand, the rear surface of the reflective mask blank for EUVL is the conductive film (rear surface conductive film) 4 surface. The quality-guaranteed region of the absorber layer 3 surface and the quality-guaranteed region of the low reflective layer surface are regions of 142×142 nm. On the other hand, the quality-guaranteed region of the conductive film (rear surface conductive film) 4 surface is a region of 146×146 nm. The measured results are fitted to quadratic function to obtain central coordinates F and B. Here, the central coordinate F is a central coordinate on the main surface side of the reflective mask blank for EUVL, and the central coordinate B is a central coordinate on the rear surface side of the reflective mask blank for EUVL. They are represented by $(X_c, Y_c)$ in the following procedure.

As described above, the quadratic function components of the surface shapes can be represented by the following formula:

$$Z=a+bX+cY+dXY+eX^2+fY^2$$

wherein, a, b, c, d, e and f are constant, and X, Y and Z are variable. Here, in the minimum square surface of the main surface or the rear surface of the mask blank, X and Y are orthogonal coordinate systems of which the origin is the center of the substrate. Z is a coordinate system orthogonal to X axis and Y axis and represents the main surface or the rear surface of the mask blank at the point (X, Y).

The central coordinates $(X_c, Y_c)$ are obtained by the following formula from constant a to f obtained by fitting the measured results to quadratic function.

$$X_c=b/(2e)$$

$$Y_c=c/(2f)$$

Further, the substrate center coordinate C is obtained by the following procedure. Here, the substrate center coordinate C is $(X_m, Y_m)$ in all of the following procedures. Further, the central coordinate F is a central coordinate on the main surface side of the reflective mask blank for EUVL, the central coordinate B is a central coordinate on the rear surface side of the reflective mask blank for EUVL, and the substrate center coordinate C is a central coordinate in the inside of the substrate 1. The procedure for obtaining the substrate center coordinate C may, for example, be (1) method that when the shapes of quality-guaranteed regions of the main surface and the rear surface of the substrate 1 before forming the reflective layer 2, the absorber layer 3 and the conductive film (rear surface conductive film) 4 or the shapes of quality-guaranteed regions of the main surface and the rear surface of the reflective mask blank for EUVL after forming the reflective layer 2, the absorber layer 3 and the conductive film (rear surface conductive film) 4 are measured by a laser interferometer, areas larger than the outlines of the main surface and the rear surface of the substrate 1 or areas larger than the outlines of the main surface and the rear surface of the reflective mask blank for EUVL are measured to obtain the outline sizes and the surface shapes of the substrate, and from them, the substrate center coordinate C is obtained together with the central coordinates F and B or (2) method that basic marks are formed in areas outside the quality-guaranteed regions of the main surface and the rear surface of the substrate 1 before forming the reflective layer 2, the absorber layer 3 and the conductive film (rear surface conductive film) 4 or in areas outside the quality-guaranteed regions of the main surface and the rear surface of the reflective mask blank for EUVL after forming the reflective layer 2, the absorber layer 3, and the conductive film (rear surface conductive film) 4, the outline sizes of the substrate and the position of the basic marks are measured by a length measuring machine or the like, the position of the substrate center coordinate C and the basic marks are calculated, and when the shapes of the quality-guaranteed regions of the main surface and the rear surface of the substrate 1 before forming the reflective layer 2, the absorber layer 3 and the conductive film (rear surface conductive film) 4 or the shapes of the quality-guaranteed regions of the main surface and the rear surface of the reflective mask blank for EUVL after forming the reflective layer 2, the absorber layer 3 and the conductive film (rear surface conductive film) 4 are measured by a laser interferometer, areas including the basic marks formed at the outsides of the quality-guaranteed regions are measured, whereby the substrate center coordinate C is obtained through the position of the basic marks together with the central coordinates F and B.

Further, the substrate center coordinate C may be obtained at any step in the process for producing the reflective mask blank for EUVL. Thus, the substrate center coordinate C may be measured at a step of the substrate 1 before forming the reflective layer 2, the absorber layer 3 and the conductive film (rear surface conductive film) 4, may be measured after forming the reflective layer 2, may be measured after forming the absorber layer 3, may be measured after forming the conductive film (rear surface conductive film) 4 or may be measured at a step of after producing the reflective mask blank for EUVL.

In a case where a substrate having a flatness of at most 100 nm is used, the flatness of a reflective mask blank for EUVL is practically determined depending on the deformation due to stress of each film to be formed on the substrate. Ideally, the deformation due to film stress has only a quadratic function component, and thereby the proportion of the quadratic function components of the surface shapes of the reflective mask blank must be close to 100%. However, in substantial, the deformation due to the film stress will have a high order function component of at least third order, because of the in-plane distribution of the film thickness, the in-plane distribution of the film composition and the error of the film formation position. Accordingly, it is necessary to increase the proportion of the quadratic function components of the surface shapes by controlling the in-plane distribution of the film thickness, the in-plane distribution of the film composition and the position of the film formation so that the distances between the central coordinates F and B and the substrate center coordinate C would fall within the predetermined ranges.

When the following condition (1) is satisfied, the proportion of the above-defined quadratic function components of the surface shape will be at least 35%.

(1) The distances between the central coordinates F and B and the substrate center coordinate C which are obtained by the above procedure are at most 0.5 mm.

Regarding the condition (1), the distances between the central coordinates F and B and the substrate center coordinate C are preferably at most 0.4 mm, more preferably at most 0.35 mm.

The following procedure may be carried out in order to obtain the reflective mask blank for EUVL wherein the proportion of the above-defined quadratic function components of the surface shapes is at least 35%.

First, the shapes of quality-guaranteed regions of the main surface and the rear surface of the substrate 1 before forming the reflective layer 2, the absorber layer 3 and the conductive film (rear surface conductive film) 4 are measured by a laser interferometer (measurement 1). The quality-guaranteed region of the main surface of the substrate 1 is a region of 142×142 mm. On the other hand, the quality-guaranteed regions of the rear surface of the substrate 1 is a region of 146×146 mm.

Next, the shapes of quality-guaranteed regions of the main surface and the rear surface of the reflective mask blank for EUVL after forming the reflective layer 2, the absorber layer 3 and the conductive film (rear surface conductive film) 4 are measured by the laser interferometer (measurement 2). In the case of the structure illustrated in FIG. 1, the main surface of the reflective mask blank for EUVL is the absorber layer 3 surface. In a case where a low reflective layer is formed on the absorber layer 3, the main surface is the low reflective layer surface. On the other hand, the rear surface of the reflective mask blank for EUVL is the conductive film (rear surface conductive film) 4 surface. The quality-guaranteed region of the absorber layer 3 surface and the quality-guaranteed region of the low reflective layer surface are regions of 142×142 mm. On the other hand, the quality-guaranteed region of the conductive film (rear surface conductive film) 4 surface is a region of 146×146 mm.

The differences between the results of the above measurements 1 and 2 are taken and fitted to quadratic function by the same procedure as described above to obtain central coordinates ΔF and ΔB. Here, the central coordinate ΔF is a central coordinate of the main surface side of the reflective mask blank for EUVL, and the central coordinate ΔB is a central coordinate of the rear surface side of the reflective mask blank for EUVL. Further, in the above procedures, both the central coordinates ΔF and ΔB are represented by $(X_c, Y_c)$.

When the following condition (2) is satisfied, the proportion of the above-defined quadratic function components of the surface shapes will be at least 35%.

(2) The distances between the central coordinates ΔF and ΔB and the substrate center coordinate C which are obtained by the above procedure are at most 0.5 mm.

Regarding the condition (2), the distances between the central coordinates ΔF and ΔB and the substrate center coordinate C are preferably at most 0.4 mm, more preferably at most 0.35 mm.

In the reflective mask blank for EUVL of the present invention, the method to satisfy the conditions (1) and (2) may, for example, be the following.

(a) The method that the film thickness distribution of each layer constituting the multilayer reflective film to be used as the reflective layer 2 is made to be at most 0.5% of the average film thickness of each layer. Alternatively, the method that using the in-plane distribution of the center wavelength of the EUV reflectivity which relates to the sum of the film thickness distributions of respective layers constituting the multilayer reflective film and the average wavelength, the in-plane distribution of the center wavelength of the EUV reflectivity is made to be at most 0.5% of the average center wavelength.

(b) The method that the film thickness distribution of the absorber layer 3 is made to be at most 1.3% of the average film thickness of the absorber layer 3. The film stress (absolute value) of the absorber layer 3 is limited to at most 200 MPa in order to obtain the desired mask pattern (for example, SEMI Standard at pp. 38 to 1102, Table 9), whereby the deformation due to film stress is relatively small, and the absorber layer 3 is permitted to have a large film thickness distribution as compared with the reflective layer (multilayer reflective film) 2 having a film stress of from 400 to 500 MPa.

(c) The method that when the low reflective layer is formed on the absorber layer 3, the film thickness distribution of the low reflective layer is made to be at most 1.3% of the average film thickness of the low reflective layer. The film stress (absolute value) of the low reflective layer is limited to at most 200 MPa in order to obtain the desired mask pattern (for example, SEMI Standard at pp. 38 to 1102, Table 9), whereby the deformation due to film stress is relatively small, and the low reflective layer is permitted to have a large film thickness distribution as compared with the reflective layer (multilayer reflective film) 2 having a film stress of from 400 to 500 MPa.

(d) The method that the film thickness distribution of the conductive film (rear surface conductive film) 4 is made to be at most 0.5% of the average film thickness of the conductive film (rear surface conductive film) 4. The conductive film ((rear surface conductive film 4) has a relatively high film stress at the same level of the reflective layer (multilayer reflective film) 2 in order to offset stress of a film formed on the surface and obtain a small blank flatness.

(e) The method that by using a known method (for example, method described in JP4862892), the reflective layer 2, the absorber layer 3 and the conductive film (rear surface conductive film) 4 are formed only on a part of, not the entire surface, the main surface or the rear surface of the substrate 1, and here, the film formed area is made to have a shape having rotational symmetry to the center of the substrate, and the center of the film formed area is positioned at at most 0.5 mm from the center of the substrate.

Among the above (a) to (e), either one may be carried out, or some of them may be carried out. Further, in the above (e), the procedure may be employed for only one among the reflective layer 2, the absorber layer 3 and the conductive film (rear surface conductive film) 4, or the procedure may be employed for two or more among them. Further, in a case where the protective layer is formed on the reflective layer 2 or in a case where the low reflective layer is formed on the absorber layer 3, such a layer may be formed in the same manner as the above.

The reflective mask blank for EUVL of the present invention may be subjected to heating treatment after forming at least one selected from the group consisting of the reflective layer 2, the absorber layer 3 and the conductive film (rear surface conductive film) 4. In such a case, the heating treatment may be carried out after forming the reflective layer 2, the heating treatment may be carried out after forming the absorber layer 3, or the heating treatment may be carried out after forming the conductive film (rear surface conductive film) 4. Further, in a case where the protective layer is formed on the reflective layer 2, the heating treatment may be carried out after forming the protective layer, and in a case where the low reflective layer is formed on the absorber layer 3, the heating treatment may be carried out after forming the low reflective layer. Further, after forming them, the heating treatments may be carried out respectively. Further, the condition for carrying out the heating treatment may be optionally selected. The heating treatment after forming the reflective layer 2 (in a case where the protective layer is formed on the reflective layer 2, after forming the protective layer) or after forming the absorber layer 3 (in a case where a low reflective layer containing no oxygen as the constituting material is formed on the absorber layer 3, after forming the low reflective layer) and the heating treatment after forming the conductive film (rear surface conductive film) 4, may be preferably carried out under a nitrogen atmosphere or under an inert gas atmosphere such as a noble gas atmosphere in order to prevent the film surface from being oxidized. On the other hand, in a case where a low reflective layer containing oxygen as the constituting material is formed on the absorber layer 3, the heating treatment may be carried out under air atmosphere.

In such a case, before and after the heating treatment, the shapes of quality-guaranteed regions of the main surface and the rear surface are measured by a laser interferometer, the difference between measured results of before and after the heating treatment is taken, and by the above-described method, the difference is fitted to quadratic function to obtain central coordinates $\Delta F_h$ and $\Delta B_h$.

Further, the distances between the central coordinates $\Delta F_h$ and $\Delta B_h$ and the substrate center coordinate C are preferably at most 0.5 mm, in order to obtain the reflective mask blank for EUVL of the present invention wherein the proportion of the above-defined quadratic function components of the surface shapes is at least 35%. The distances are more preferably at most 0.4 mm, further preferably at most 0.35 mm In a case where the heating treatment is carried out after forming the reflective layer 2, the main surface of the reflective mask blank for EUVL is the reflective layer 2 surface (in a case where the protective layer is formed on the reflective layer 2, the main surface is the protective layer). On the other hand, the rear surface of the reflective mask blank for EUVL is the rear surface of the substrate 1 or the conductive film (rear surface conductive film) 4 surface. Further, in a case where the conductive film (rear surface conductive film) 4 is formed after carrying out the heating treatment after forming the reflective layer 2 (after forming the protective layer), the rear surface of the substrate 1 is the rear surface of the reflective mask blank for EUVL. On the other hand, in a case where the conductive film (rear surface conductive film) 4 surface is the rear surface of the reflective mask blank for EUVL, the conductive film (rear surface conductive film) 4 is formed before carrying out the heating treatment after forming the reflective layer 2 (after forming the protective layer).

In a case where the heating treatment is carried out after forming the absorber layer 3, the main surface of the reflective mask blank for EUVL is the absorber layer 3 surface (in a case where the low reflective layer is formed on the absorber layer 3, the main surface is the low reflective layer surface). On the other hand, the rear surface of the reflective mask blank for EUVL is the rear surface of the substrate 1 or the conductive film (rear surface conductive film) 4 surface. Further, in a case where after carrying out the heating treatment after forming the absorber layer 3 (after forming the low reflective layer), the conductive film (rear surface conductive film) 4 is formed, the rear surface of the substrate 1 is the rear surface of the reflective mask blank for EUVL. On the other hand, in a case where the conductive film (rear surface conductive film) 4 surface is the rear surface of the reflective mask blank for EUVL, the conductive film (rear surface conductive film) 4 is formed before carrying out the heating treatment after forming the absorber layer 3 (after forming the low reflective layer).

In a case where the heating treatment is carried out after forming the conductive film (rear surface conductive film) 4, the main surface of the reflective mask blank for EUVL is the main surface of the substrate 1, the reflective layer 2 surface (in a case where the protective layer is formed on the reflective layer 2, the protective layer surface) or the absorber layer 3 surface (in a case where the low reflective layer is formed on the absorber layer 3, the low reflective layer surface). Further, in a case where after forming the conductive film (rear surface conductive film) 4, the reflective layer 2 is formed, the main surface of the substrate 1 is the main surface before and after forming the conductive film (rear surface conductive film) 4. On the other hand, in a case where the reflective layer 2 surface (in a case where the protective layer is formed on the reflective layer 2, the protective layer surface) is the main surface before and after forming the conductive film (rear surface conductive film) 4, the reflective layer 2 is formed before forming the conductive film (rear surface conductive film) 4. In a case where the absorber layer 3 surface (in a case where the low reflective layer is formed on the absorber layer 3, the low reflective layer surface) is the main surface before and after forming the conductive film (rear surface conductive film) 4, the absorber layer 3 (low reflective layer) is formed before forming the conductive film (rear surface conductive film) 4.

The quality-guaranteed region of the main surface of the substrate 1, the quality-guaranteed region of the reflective layer 2 surface (protective layer surface), the quality-guaranteed region of the absorber layer 3 surface (low reflective layer surface), the quality-guaranteed region of the rear surface of the substrate 1 and the quality-guaranteed region of the conductive film (rear surface conductive film) 4 are as described above.

In the reflective mask blank for EUVL of the present invention, as the method to make the distances between the differences $\Delta F_h$ and $\Delta B_h$ of the central coordinates and the substrate center coordinate C at most 0.5 mm, the method may, for example, be mentioned that the temperature distribution at the time of heating treatment of the quality-guaranteed regions of the main surface and the rear surface of the reflective mask blank for EUVL is made to be at most 20% of the average temperature at the time of heating treatment of the quality-guaranteed regions.

EXAMPLES

Now, the present invention will be described in further detail with reference to Examples. However, the present invention is by no means restricted thereto.

In this Example, as a substrate 1 for film formation, a $SiO_2$—$TiO_2$ type glass substrate (size: 6 inches (152 mm) square, thickness: 6.35 mm) is used. The quality-guaranteed regions of the main surface and the rear surface of the substrate 1 are measured by a laser interferometer (e.g. "Verifire, Mark IV", manufactured by Zygo Corporation, "G310S" manufactured by Fujinon Inc. or "FlatMaster" manufactured by Tropel) to obtain the flatness at the quality-guaranteed regions of the main surface and the rear surface. Further, the measured results by the laser interferometer are fitted to quadratic function to obtain the central coordinates $F_0$ and $B_0$ of the quadratic function fitting. The quality-guaranteed region of the main surface of the substrate 1 is a region of 142×142 mm. The quality-guaranteed region of the rear surface of the substrate 1 is a region of 146×146 mm.

Then, by using a sputtering method, a CrN film having a thickness of 360 nm is formed on the rear surface of the substrate 1 as the conductive film (rear surface conductive film) 4. Then, by using a sputtering method, forming a Si film and a Mo film on the main surface of the substrate 1 alternatively is repeated 40 times to form a Mo/Si multilayer reflective film having the total film thickness of 272 nm ((4.5 nm+2.3 nm)×40) as the reflective layer 2. Then, by using a sputtering method, a Ru film (film thickness: 2.5 nm) is formed on the Mo/Si multilayer reflective film (reflective layer 2) as the protective layer. Then, by using a sputtering method, a TaN film (film thickness: 77 nm) is formed on the Ru film (protective layer) as the absorber layer 3. Then, by using a sputtering method, a TaON film (thickness: 7 nm) is formed on the TaN film (absorber layer 3) as the low reflective layer. Then, after forming the TaON film (low reflective layer), heating treatment is carried out at 136° C. for 20 minutes under air atmosphere to prepare a reflective mask blank for EUVL. Further, in a case where constituting materials of the low reflective layer contains no oxygen, after forming the low reflective layer, heating treatment is carried out under a nitrogen atmosphere or an inert gas atmosphere.

Then, after carrying out the heating treatment, the shapes of quality-guaranteed regions of the main surface and the rear surface of the reflective mask blank for EUVL are measured by a laser interferometer. The main surface of the reflective mask blank for EUVL is the low reflective layer (TaON film) surface. On the other hand, the rear surface of the reflective mask blank for EUVL is the conductive film (rear surface conductive film) (CrN film) 4 surface. The quality-guaranteed region of the low reflective layer (TaON film) surface is a region of 142×142 mm. On the other hand, the quality-guaranteed region of the conductive film (rear surface conductive film) (CrN film) 4 surface is a region of 146×146 mm.

From the measured results by the interferometer, the flatness at the quality-guaranteed regions of the main surface and the rear surface of the reflective mask blank for EUVL is obtained.

Further, the measured results by the interferometer are fitted to quadratic function. From the results of the quadratic function fitting, the proportion of the above-defined quadratic function components of the surface shapes and the central coordinates F and B of the quadratic function fitting are obtained.

The distance between the central coordinate (F or B) of which the proportion of the above-defined quadratic function component of the surface shape is smaller between the central coordinates F and B obtained by the above procedure and the substrate center coordinate C is obtained as $L_{blank}$ (mm).

Further, the distance between the central coordinate ($\Delta F$ or $\Delta B$) of which the proportion of the above-defined quadratic function component of the surface shape is smaller between the central coordinates $\Delta F$ and $\Delta B$ obtained by the above procedure and the substrate center coordinate C is obtained as $L_{deformation}$ (mm).

Further, in a case where the flatness of the mask blank is approximated to polynomial, the overlay error due to a high polynomial component of at least third order which cannot be corrected at the time of the semiconductor exposure tool, is obtained by the following procedure.

A mask is prepared by the procedure described in Non-Patent Document 1, an exposure test on a wafer is carried out, and the overlay accuracy to be obtained becomes values mentioned in Table 1. Here, the quadratic function component can be corrected by e.g. the magnification correction at the time of exposure in accordance with the procedure described in Non-Patent Document 2 and 3. These results are mentioned in the following Table.

TABLE 1

| Ex. | Flatness of substrate (nm) | | Blank flatness (nm) | | Proportion of quadratic function component in blank flatness (%) | | $L_{blank}$ (mm) | $L_{deformation}$ (mm) | Overlay error due to component which cannot be corrected by blank flatness correction (nm) |
|---|---|---|---|---|---|---|---|---|---|
| | Main surface | Rear surface | Main surface | Rear surface | Main surface | Rear surface | | | |
| 1 | 60 | 70 | 358 | 407 | 90 | 92 | 0.02 | 0.01 | 0.9 |
| 2 | 49 | 73 | 174 | 230 | 76 | 88 | 0.04 | 0.01 | 1.1 |
| 3 | 66 | 61 | 352 | 398 | 92 | 94 | 0.04 | 0.02 | 0.7 |
| 4 | 77 | 47 | 364 | 372 | 88 | 92 | 0.05 | 0.02 | 1.1 |
| 5 | 40 | 43 | 157 | 159 | 84 | 64 | 0.11 | 0.12 | 1.4 |
| 6 | 71 | 78 | 97 | 192 | 47 | 89 | 0.13 | 0.12 | 1.3 |
| 7 | 82 | 63 | 220 | 218 | 97 | 59 | 0.14 | 0.17 | 2.2 |
| 8 | 46 | 81 | 95 | 65 | 57 | 52 | 0.23 | 0.35 | 0.8 |
| 9 | 43 | 71 | 138 | 62 | 77 | 39 | 0.29 | 0.10 | 1.0 |
| 10 | 66 | 46 | 126 | 156 | 36 | 85 | 0.29 | 0.15 | 2.0 |
| 11 | 60 | 53 | 166 | 203 | 70 | 32 | 0.84 | 2.05 | 3.4 |
| 12 | 88 | 52 | 190 | 187 | 76 | 22 | 0.96 | 1.64 | 3.6 |
| 13 | 57 | 56 | 56 | 187 | 61 | 9 | 2.32 | 4.50 | 4.2 |

Figure 2:
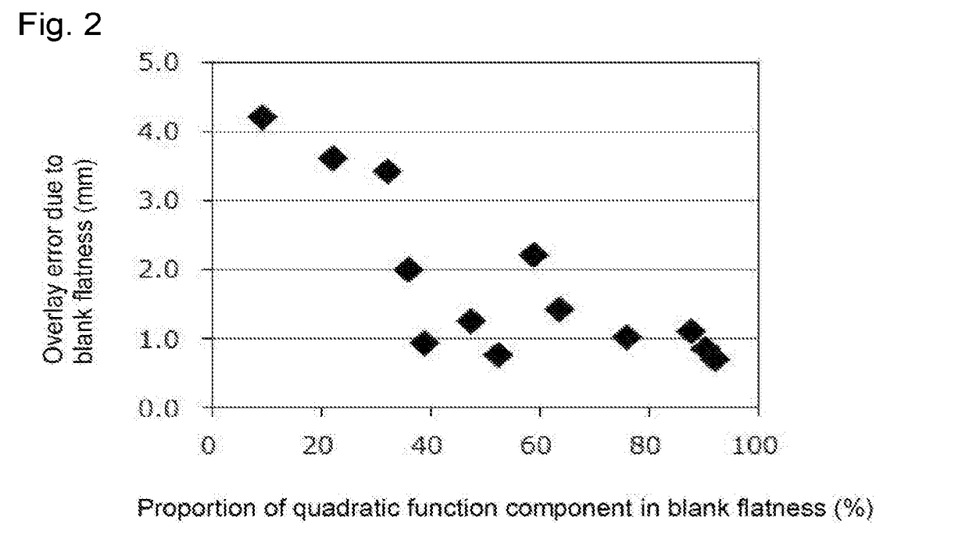
FIG. 2 is a graph illustrating the relationship of the overlay error due to the flatness of the mask blank and the proportion of the quadratic function components of the flatness of the mask blank.

Further, the relationship between the overlay error due to the blank flatness and the proportion of the quadratic function components in the blank flatness is shown in FIG. 2. It is evident from FIG. 2 that when the proportion of the quadratic function component in the blank flatness is at least 35%, the overlay error due to the blank flatness is small at a level of at most 2.2 nm.

Figure 3:
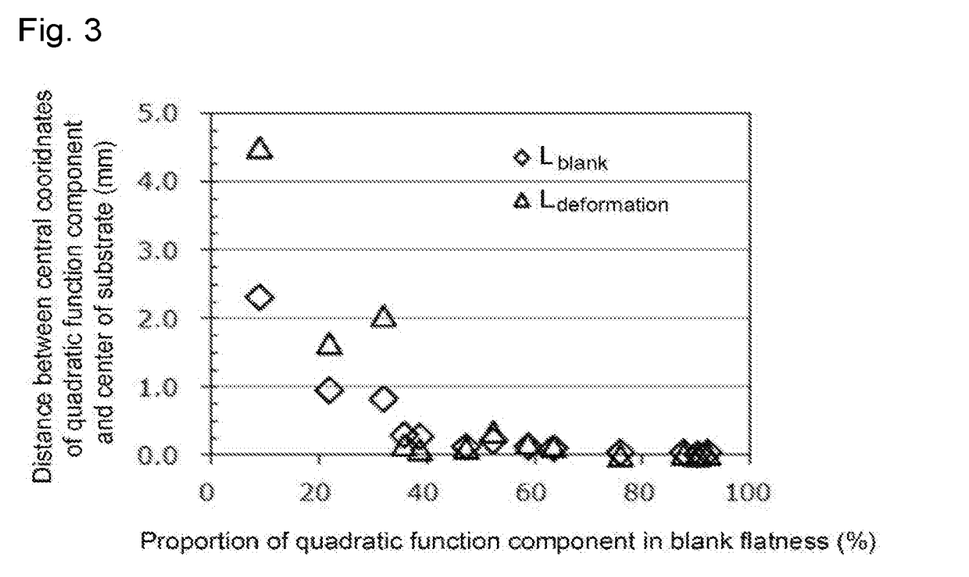
FIG. 3 is a graph illustrating the relationship of the proportion of the quadratic function components of the flatness of the mask blank and the distance between the central coordinates of the quadratic function components and the center of the substrate.

The relationship of the proportion of the quadratic function components in the blank flatness and the distance ($L_{blank}$) and the relationship of the proportion of the quadratic function component and the distance $L_{deformation}$ are shown in FIG. 3. Here, the distance ($L_{blank}$) is a distance between the substrate center coordinate C and the central coordinate (F or B) of which the proportion of the above-defined quadratic function components of the surface shapes is smaller between the central coordinates F and B, and the distance ($L_{deformation}$) is a distance between the substrate center coordinate C and the central coordinate ($\Delta F$ or $\Delta B$) of which the proportion of the above-defined quadratic function component of the surface shapes is smaller between the central coordinates $\Delta F$ and $\Delta B$. It is evident from FIG. 3 that when $L_{blank}$ or $L_{deformation}$ are at most 0.5 mm, the proportion of the quadratic function component in the blank flatness is made to be stably at least 35%, whereby the overlay error at the time of transferring a pattern on a mask to a wafer by a semiconductor exposure tool can be sufficiently small.

REFERENCE SYMBOLS

1: Substrate
2: Reflective layer (multilayer reflective film)
3: Absorber layer
4: (Rear surface) conductive film

What is claimed is:

1. A reflective mask blank for EUVL, which is a reflective mask blank for EUV lithography having a reflective layer for reflecting EUV light and an absorber layer for absorbing EUV light formed in this order on a main surface of a substrate and having a conductive film formed on a rear surface opposite to the main surface, of the substrate,
wherein when the absolute value of flatness of 142×142 mm regions of a main surface of the reflective mask blank and the absolute value of flatness of 146×146 mm regions of a rear surface of the reflective mask blank are measured by a laser interferometer, and the measured values of the flatness are fitted to a quadratic function, the proportion of the quadratic function components is at least 35%, and the absolute value of flatness at the 142×142 mm regions of the main surface of the reflective mask blank and the absolute value of flatness of 146×146 mm regions of the rear surface of the reflective mask blank is at most 600 nm, and
wherein the overlay error due to blank flatness is at most 2.2 nm.

2. The reflective mask blank for EUVL according to claim 1, wherein between the reflective layer and the absorber layer, a protective layer for the reflective layer is formed.

3. The reflective mask blank for EUVL according to claim 1, wherein on the absorber layer, a low reflective layer for inspection light to be used for inspection of a mask pattern is formed.

4. The reflective mask blank for EUVL according to claim 1, wherein the absolute value of flatness at the 142×142 mm regions of the main surface of the reflective mask blank and the absolute value of flatness of 146×146 mm regions of the rear surface of the reflective mask blank is at most 500 nm.

5. The reflective mask blank for EUVL according to claim 1, wherein the absolute value of flatness at the 142×142 mm regions of the main surface of the reflective mask blank and the absolute value of flatness of 146×146 mm regions of the rear surface of the reflective mask blank is at most 407 nm.

6. A reflective mask blank for EUVL, which is a reflective mask blank for EUV lithography having a reflective layer for reflecting EUV light and an absorber layer for absorbing EUV light formed in this order on a main surface of a substrate and having a conductive film formed on a rear surface opposite to the main surface, of the substrate,
wherein when the absolute value of flatness of 142×142 mm regions of a main surface of the reflective mask blank and the absolute value of flatness of 146×146 mm regions of a rear surface of the reflective mask blank are measured by a laser interferometer, and the measured values of the flatness are fitted to a quadratic function to obtain central coordinate F on the main surface of the reflective mask blank and central coordinate B on the rear surface of the reflective mask blank, the distances between the central coordinates F and B obtained and the center coordinate C of the substrate, which coordinate is a central coordinate in the inside of the substrate, are at most 0.5 mm, and the absolute value of flatness at the 142×142 mm regions of the main surface of the reflective mask blank and the absolute value of flatness of 146×146 mm regions of the rear surface of the reflective mask blank is at most 600 nm, and wherein the overlay error due to blank flatness is at most 2.2 nm.

7. The reflective mask blank for EUVL according to claim 6, wherein after forming at least one selected from the group consisting of the reflective layer, the absorber layer and the conductive film, a heating treatment is carried out, and when the absolute value of flatness of 142×142 mm regions of the main surface of the reflective mask blank and the absolute value of flatness of 146×146 mm regions of the rear surface of the reflective mask blank are measured by a laser interferometer respectively before and after the heating treatment, and the differences of the absolute value of flatness of the 142×142 mm regions of the main surface of the reflective mask blank and the absolute value of flatness of 146×146 mm regions of the rear surface of the reflective mask blank before and after the heating treatment, are fitted to a quadratic function to obtain central coordinate $\Delta F_h$ on the main surface of the reflective mask blank and central coordinate $\Delta B_h$ on the rear surface of the reflective mask blank, the distances between the central coordinates $\Delta F_h$ and $\Delta B_h$ obtained and the center coordinate C of the substrate are at most 0.5 mm.

8. The reflective mask blank for EUVL according to claim 6, wherein between the reflective layer and the absorber layer, a protective layer for the reflective layer is formed.

9. The reflective mask blank for EUVL according to claim 6, wherein on the absorber layer, a low reflective layer for inspection light to be used for inspection of a mask pattern is formed.

10. The reflective mask blank for EUVL according to claim 6, wherein the absolute value of flatness at the 142×142 mm regions of the main surface of the reflective mask blank and the absolute value of flatness of 146×146 mm regions of the rear surface of the reflective mask blank is at most 500 nm.

11. The reflective mask blank for EUVL according to claim 6, wherein the absolute value of flatness at the 142×142 mm regions of the main surface of the reflective mask blank and the absolute value of flatness of 146×146 mm regions of the rear surface of the reflective mask blank is at most 407 nm.

12. A reflective mask blank for EUVL which is a reflective mask blank for EUV lithography having a reflective layer for reflecting EUV light and an absorber layer for absorbing EUV light formed in this order on a main surface of a substrate and having a conductive film formed on a rear surface opposite to the main surface, of the substrate, wherein the absolute value of flatness of 142×142 mm regions of a main surface of the reflective mask blank and the absolute value of flatness of 146×146 mm regions of a rear surface of the reflective mask blank, and the absolute value of flatness of 142×142 mm regions of the main surface of the substrate and the absolute value of flatness of 146×146 mm regions of the rear surface of the substrate before forming the reflective layer, the absorber layer and the conductive film are measured by a laser interferometer respectively, and the differences between the absolute value of flatness of 142×142 mm regions of the main surface of the reflective mask blank and the absolute value of flatness of 146×146 mm regions of the rear surface of the reflective mask blank, and the absolute value of flatness of 142×142 mm regions of the main surface of the substrate and the absolute value of flatness of 146×146 mm regions of the rear surface of the substrate, are fitted to a quadratic function to obtain central coordinate $\Delta F$ on the main surface of the reflective mask blank and central coordinate $\Delta B$ on the rear surface of the reflective mask blank, the distances between the central coordinates $\Delta F$ and $\Delta B$ obtained and the center coordinate C of the substrate, which coordinate is a central coordinate in the inside of the substrate, are at most 0.5 mm, and the absolute value of flatness at the 1427×142 mm regions of the main surface of the reflective mask blank and the absolute value of flatness of 146×146 mm regions of the rear surface of the reflective mask blank is at most 600 nm, and wherein the overlay error due to blank flatness is at most 2.2 nm.

13. The reflective mask blank for EUVL according to claim 12, wherein after forming at least one selected from the group consisting of the reflective layer, the absorber layer and the conductive film, a heating treatment is carried out, and when the absolute value of flatness of 142×142 mm regions of the main surface of the reflective mask blank and the absolute value of flatness of 146×146 mm regions of the rear surface of the reflective mask blank are measured by a laser interferometer respectively before and after the heating treatment, and the differences of the absolute value of flatness of the 142×142 mm regions of the main surface of the reflective mask blank and the absolute value of flatness of 146×146 mm regions of the rear surface of the reflective mask blank before and after the heating treatment, are fitted to a quadratic function to obtain central coordinate $\Delta F_h$ on the main surface of the reflective mask blank and central coordinate $\Delta B_h$ on the rear surface of the reflective mask blank, the distances between the central coordinates $\Delta F_h$ and $\Delta B_h$ obtained and the center coordinate C of the substrate are at most 0.5 mm.

14. The reflective mask blank for EUVL according to claim 12, wherein between the reflective layer and the absorber layer, a protective layer for the reflective layer is formed.

15. The reflective mask blank for EUVL according to claim 12, wherein on the absorber layer, a low reflective layer for inspection light to be used for inspection of a mask pattern is formed.

16. The reflective mask blank for EUVL according to claim 12, wherein the absolute value of flatness at the 142×142 mm regions of the main surface of the reflective mask blank and the absolute value of flatness of 14×146 mm regions of the rear surface of the reflective mask blank is at most 500 nm.

17. The reflective mask blank for EUVL according to claim 12, wherein the absolute value of flatness at the 142×142 mm regions of the main surface of the reflective mask blank and the absolute value of flatness of 146×146 mm regions of the rear surface of the reflective mask blank is at most 407 nm.

* * * * *